(12) United States Patent
Wang et al.

(10) Patent No.: US 10,873,118 B2
(45) Date of Patent: Dec. 22, 2020

(54) TUNABLE FILTER AND TUNABLE FILTERING DEVICE

(71) Applicant: HUAWEI TECHNOLOGIES CO., LTD., Shenzhen (CN)

(72) Inventors: Hui Wang, Xi'an (CN); Qing Zhao, Xi'an (CN); Guoxiang Cao, Xi'an (CN); Jinyuan Xie, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/457,786

(22) Filed: Jun. 28, 2019

(65) Prior Publication Data

US 2019/0326655 A1   Oct. 24, 2019

Related U.S. Application Data

(63) Continuation of application No. PCT/CN2016/113882, filed on Dec. 30, 2016.

(51) Int. Cl.
*H01P 1/207* (2006.01)
*H01P 3/12* (2006.01)

(52) U.S. Cl.
CPC ............... *H01P 1/207* (2013.01); *H01P 3/12* (2013.01)

(58) Field of Classification Search
CPC .. H01P 1/207; H01P 1/208; H01P 3/12; H01P 7/06
USPC .......................... 333/209, 210, 212, 208, 235
See application file for complete search history.

(56) References Cited

U.S. PATENT DOCUMENTS

| | | | |
|---|---|---|---|
| 4,761,625 | A | 8/1988 | Sharma |
| 5,808,528 | A | 9/1998 | Griffith et al. |
| 6,392,508 | B1 | 5/2002 | Damphousse et al. |
| 2003/0117243 | A1 | 6/2003 | Cooper |
| 2004/0017272 | A1* | 1/2004 | Smith ............... H01P 1/207 333/209 |
| 2012/0126914 | A1 | 5/2012 | Miyamoto et al. |
| 2015/0035623 | A1 | 2/2015 | Kwak et al. |
| 2016/0118702 | A1 | 4/2016 | Xu |
| 2017/0288289 | A1 | 10/2017 | Zhao et al. |

FOREIGN PATENT DOCUMENTS

| | | |
|---|---|---|
| CN | 101378142 A | 3/2009 |
| CN | 101640300 A | 2/2010 |
| CN | 201562744 U | 8/2010 |

(Continued)

*Primary Examiner* — Stephen E. Jones

(57) ABSTRACT

Embodiments of the present invention provide a tunable filter and a tunable filtering device. The tunable filter includes: a cavity, a filtering component that is in the cavity and that is provided on a first surface thereof with at least one through hole, a drive mechanism, and at least one first adjustable component and at least one second adjustable component that are connected to the drive mechanism and that run through the first surface of the cavity; one end of one first adjustable component is disposed opposite to one of the at least one through hole; one end of one second adjustable component is disposed opposite to a position between two adjacent through holes in the at least one through hole; and the drive mechanism controls the at least one first adjustable component to synchronously move, and controls the at least one second adjustable component to synchronously move.

18 Claims, 6 Drawing Sheets

(56) References Cited

FOREIGN PATENT DOCUMENTS

| | | | |
|---|---|---|---|
| CN | 102804484 | A | 11/2012 |
| CN | 203434256 | U | 2/2014 |
| CN | 103891041 | A | 6/2014 |
| CN | 105280998 | A | 1/2016 |
| CN | 105280999 | A | 1/2016 |
| CN | 105529516 | A | 4/2016 |
| CN | 205355216 | U | 6/2016 |
| EP | 1885017 | A1 | 2/2008 |
| EP | 2448060 | A1 | 5/2012 |
| JP | 2013128210 | A | 6/2013 |
| JP | 2016119531 | A | 6/2016 |
| WO | 2010133049 | A1 | 11/2010 |
| WO | 2016095165 | A1 | 6/2016 |

* cited by examiner

TUNABLE FILTER AND TUNABLE FILTERING DEVICE

CROSS-REFERENCE TO RELATED APPLICATIONS

This application is a continuation of International Application No. PCT/CN2016/113882, filed on Dec. 30, 2016, the disclosure of which is hereby incorporated by reference in its entirety.

TECHNICAL FIELD

Embodiments of the present invention relate to the field of electronic communications technologies, and in particular, to a tunable filter and a tunable filtering device.

BACKGROUND

A tunable filter is an important constituent part of a microwave communications system, and is widely applied to aspects such as frequency-hopping radio, electronic countermeasure, a multifunctional receiver, and a dynamic frequency allocation system.

Currently, there is atunable tunable E-plane filter that has a simple structure and whose frequency is convenient to be adjusted. As shown in FIG. 1, a rectangular waveguide tube in the tunable E-plane filter is divided, at a central position of an H plane of the rectangular waveguide tube, into a first waveguide part 11 and a second waveguide part 12 along an E plane of the rectangular waveguide tube, and a metal plate 13 disposed parallel to the E plane is sandwiched between the first waveguide part 11 and the second waveguide part 12. In addition, in the rectangular waveguide tube in the filter, at least one dielectric plate 14 is further disposed along a longitudinal extension direction of the metal plate 13, and the at least one dielectric plate 14 is connected to an external drive mechanism 15. The external drive mechanism 15 may externally change a relative position relationship between the dielectric plate 14 and the metal plate 13. In other words, both a position and an angle of the dielectric plate in the tunable E-plane filter may change. When the position and the angle of the dielectric plate change, an electrical length in a direction of the H plane accordingly changes, thereby changing a central frequency of the tunable E-plane filter.

However, because a size of the metal plate in the E-plane filter is fixed, during an actual use process, bandwidth of the E-plane filter increases as the central frequency increases, causing a relatively poor filtering effect of the E-plane filter.

SUMMARY

The present invention provides a tunable filter and a tunable filtering device, to resolve a problem that an existing tunable E-plane filter has a relatively poor filtering effect.

To achieve the foregoing objective, the following technical solutions are used in the present invention:

According to a first aspect, a tunable filter is provided. The tunable filter includes a cavity, a filtering component that is in the cavity and that is provided on a first surface thereof with at least one through hole, a drive mechanism, and at least one first adjustable component and at least one second adjustable component that are connected to the drive mechanism and that run through the first surface of the cavity. Specifically, one end of one first adjustable component is disposed opposite to one of the at least one through hole, and a cross sectional area of the end of the first adjustable component is greater than or equal to a cross sectional area of the other end of the first adjustable component; one end of one second adjustable component is disposed opposite to a position between two adjacent through holes in the at least one through hole, and a cross sectional area of the end of the second adjustable component is greater than or equal to a cross sectional area of the other end of the second adjustable component; and the drive mechanism controls the at least one first adjustable component to synchronously move, to change a distance between the at least one first adjustable component and the filtering component, and controls the at least one second adjustable component to synchronously move, to change a distance between the at least one second adjustable component and the filtering component.

Because one end of each first adjustable component is disposed opposite to one of the at least one through hole, the change in the distance between the at least one first adjustable component and the filtering component causes a central frequency of the tunable filter to accordingly change. One end of each second adjustable component is disposed opposite to a position between two adjacent through holes in the at least one through hole, and the change in the distance between the at least one second adjustable component and the filtering component causes bandwidth of the tunable filter to accordingly change. If the distance between the at least one first adjustable component and the filtering component increases, the central frequency of the tunable filter also increases. When the distance between the at least one second adjustable component and the filtering component is not adjusted, the bandwidth of the tunable filter increases as the central frequency increases. For the tunable filter in this embodiment of the present invention, the bandwidth of the tunable filter may be changed by adjusting the distance between the at least one second adjustable component and the filtering component, so that when the central frequency increases, it is also ensured that the bandwidth of the tunable filter remains unchanged.

Optionally, in a possible implementation of this embodiment of the present invention, the drive mechanism includes one sub drive mechanism. In this application scenario, the sub drive mechanism is connected to both the at least one first adjustable component and the at least one second adjustable component; and the sub drive mechanism controls the at least one first adjustable component and the at least one second adjustable component to synchronously move.

Optionally, in another possible implementation of this embodiment of the present invention, in the application scenario in which the drive mechanism includes one sub drive mechanism, the sub drive mechanism in the drive mechanism includes a drive component and a drive rod that are connected by using a fastener; the drive component includes a drive shaft and a drive rotor; and the drive rod is connected to both the at least one first adjustable component and the at least one second adjustable component. The drive rotor of the drive component controls the drive shaft of the drive component to rotate, to drive the drive rod to move, so that the distance between the at least one first adjustable component and the filtering component and the distance between the at least one second adjustable component and the filtering component change.

Optionally, in another possible implementation of this embodiment of the present invention, in the application scenario in which the drive mechanism includes one sub drive mechanism, the sub drive mechanism in the drive mechanism further includes a fastening component located between the fastener and the drive rotor of the drive component, and at least one anti-wobble apparatus that runs through the fastening component and that is connected to the drive rod.

Optionally, in another possible implementation of this embodiment of the present invention, in the application scenario in which the drive mechanism includes one sub drive mechanism, the sub drive mechanism in the drive mechanism further includes a fastening component located between the fastener and the drive rotor of the drive component, and at least one elastic apparatus that runs through the fastening component and that is connected to the drive rod.

Optionally, in another possible implementation of this embodiment of the present invention, the drive mechanism of the tunable filter may include two sub drive mechanisms. In this application scenario; one of the two sub drive mechanisms is connected to the at least one first adjustable component, and the other sub drive mechanism is connected to the at least one second adjustable component; the sub drive mechanism controls the at least one first adjustable component to synchronously move; and the other sub drive mechanism controls the at least one second adjustable component to synchronously move.

Optionally, in another possible implementation of this embodiment of the present invention, the tunable filter further includes at least two third adjustable components that are connected to the drive mechanism, disposed at two ends of the first surface of the first cavity, and run through the first surface of the cavity. The drive mechanism controls the at least two third adjustable components to synchronously move, to change a distance between each of the at least two third adjustable components and the filtering component.

As the distance between each of the at least two third adjustable components and the filtering component changes, a change range of the central frequency of the tunable filter accordingly changes.

Optionally, in another possible implementation of this embodiment of the present invention, in a scenario in which the tunable filter includes at least one first adjustable component, at least one second adjustable component, and at least one third adjustable component, the drive mechanism may include one sub drive mechanism, and the sub drive mechanism is connected to all of the at least one first adjustable component, the at least one second adjustable component, and the at least one third adjustable component. The sub drive mechanism controls the at least one first adjustable component, the at least one second adjustable component, and the at least one third adjustable component to synchronously move.

Optionally, in another possible implementation of this embodiment of the present invention, in a scenario in which the tunable filter includes at least one first adjustable component, at least one second adjustable component, and at least one third adjustable component, the drive mechanism may alternatively include two sub drive mechanisms, one of the two sub drive mechanisms is connected to both the at least one first adjustable component and the at least one second adjustable component, and the other sub drive mechanism is connected to the at least one third adjustable component.

In the scenario in which the tunable filter includes the at least one first adjustable component, the at least one second adjustable component, and the at least one third adjustable component, if the drive mechanism includes the two sub drive mechanisms, one sub drive mechanism may be connected to one type of adjustable component in the at least one first adjustable component, the at least one second adjustable component, and the at least one third adjustable component, and the other sub drive mechanism may be connected to both the other two types of adjustable components.

Optionally, in another possible implementation of this embodiment of the present invention, the drive mechanism controls the at least one first adjustable component to synchronously move along a direction perpendicular to the first surface of the filtering component; and the drive mechanism controls the at least one second adjustable component to synchronously move along a direction perpendicular to the first surface of the filtering component.

According to a second aspect, a tunable filtering device is provided. The tunable filtering device includes the tunable filter according to any one of the first aspect or the possible implementations of the first aspect.

In the embodiments of the present invention, the name of the tunable filter does not constitute a limitation on devices or functional modules, and during actual implementation, these devices or functional modules may have other names. The devices or functional modules fall within the scope of the claims of the present invention and equivalent technologies thereof, provided that the devices or functional modules have functions that are similar to those in the present invention.

These aspects or another aspect of the embodiments of the present invention are more concise and easier to understand in the following descriptions.

DESCRIPTION OF EMBODIMENTS

The following describes the technical solutions in the embodiments of the present invention in detail with reference to the accompanying drawings in the embodiments of the present invention.

In the specification, claims, and accompanying drawings of the present invention, the terms "first", "second", and so on are intended to distinguish between different objects but do not limit a particular order. In addition, the terms "including", "including", or any other variant thereof, are intended to cover a non-exclusive inclusion. For example, a process, a method, a system, a product, or a device that includes a series of steps or units is not limited to the listed steps or units, but optionally further includes an unlisted step or unit, or optionally further includes another inherent step or unit of the process, the method, the product, or the device.

In addition, the term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

In the description of the present invention, unless otherwise stated, "plurality of" means two or more.

In addition, in the embodiments of the present invention, the word "exemplary" or "for example" is used to represent giving an example, an illustration, or a description. Any embodiment or design scheme described as "example" or "for example" in the embodiments of the present invention should not be explained as being more preferable or having more advantages than another embodiment or design scheme. Exactly, use of a term such as "example" or "for example" aims to present a related concept in a specific manner.

A tunable filter provided in the embodiments of the present invention is applied to a communications system that includes a radio access network device.

Figure 1:
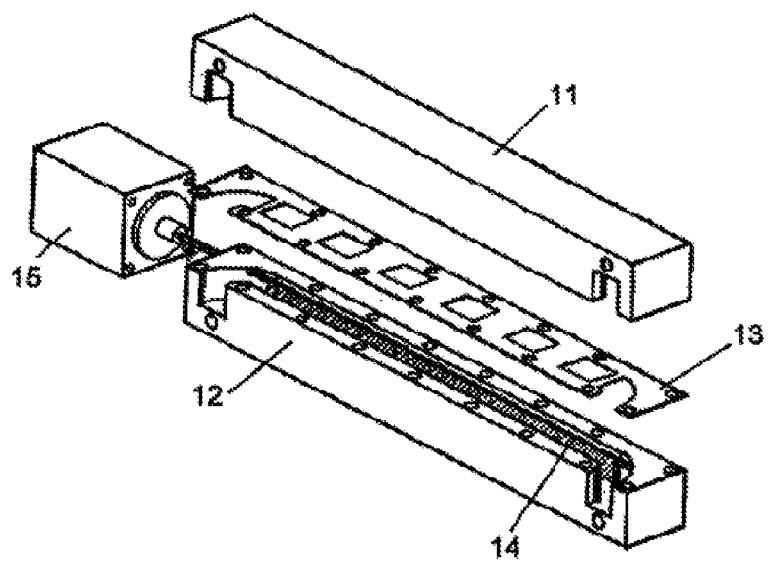
FIG. 1 is a schematic structural diagram of a tunable filter in the prior art.
Figure 2:
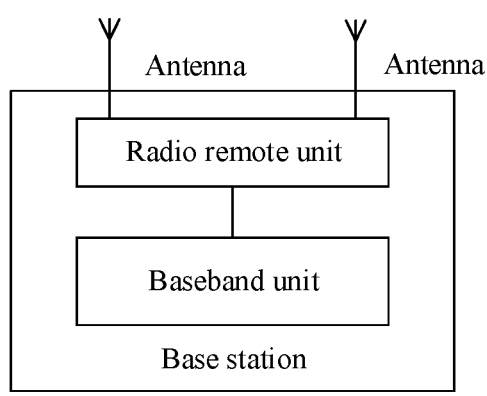
FIG. 2 is a schematic structural diagram of hardware of a base station according to an embodiment of the present invention.

For example, the radio access network device may be a base station. For a hardware structure of the base station in the embodiments of the present invention, refer to constituent parts of the base station shown in FIG. 2. As shown in FIG. 2, the base station includes: a BBU (baseband unit), an RRU (radio remote unit), and an antenna. The BBU may be connected to the RRU by using an optical fiber, and the RRU is connected to the antenna by using a coaxial cable and a power divider (coupler). Usually, one BBU may be connected to a plurality of RRUs.

The BBU is configured to implement baseband processing functions (such as encoding, multiplexing, modulation, and spread spectrum) on a Uu interface (namely, an interface between a terminal device and the base station), an interface function on a logic interface between an RNC (radio network controller) and the base station, signaling processing, local and remote operation and maintenance functions, work status monitoring and alarm information reporting functions of the base station, and the like.

The RRU may include four modules: a digital intermediate frequency module, a transceiver module, a power amplifier module, and a filtering module. The digital intermediate frequency module is used for modulation and demodulation, digital frequency up-/down-conversion, digital-to-analog conversion, and the like of optical transmission. The transceiver module converts an intermediate frequency signal into a radio frequency signal, and after being amplified by the power amplifier module and filtered by the filtering module, the radio frequency signal is transmitted by using the antenna. The filtering module may be a filter in the base station.

The embodiments of the present invention provide the tunable filter. When a central frequency of the tunable filter is increased, bandwidth of the tunable filter may be changed by adjusting a distance between at least one second adjustable component and a filtering component in the tunable filter, so that when the central frequency of the tunable filter is increased, the bandwidth of the tunable filter remains unchanged, thereby improving a filtering effect of the filter, and preventing the bandwidth of the tunable filter from increasing as the central frequency of the tunable filter is increased.

Figure 3:
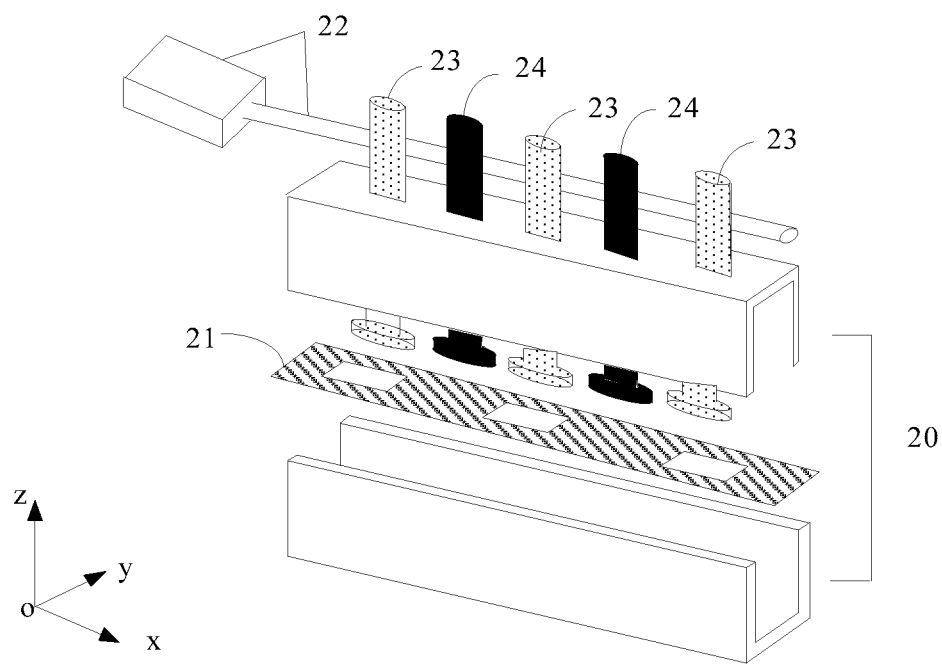
FIG. 3 is a first exploded three-dimensional view of a tunable filter according to an embodiment of the present invention.

As shown in FIG. 3, the tunable filter provided in the embodiments of the present invention includes a cavity 20, a filtering component 21 disposed in the cavity 20, a drive mechanism 22, and at least one first adjustable component 23 and at least one second adjustable component 24 that are connected to the drive mechanism 22 and that run through a first surface of the cavity 20 (the first surface of the cavity 20 is an xoy plane in FIG. 3).

It should be noted that, for ease of understanding, in the accompanying drawings of the embodiments of the present invention, the cavity 20 is represented as two parts. During actual application, the cavity 20 is a whole.

The filtering component 21 in the embodiments of the present invention may be a metal plate.

Figure 4:
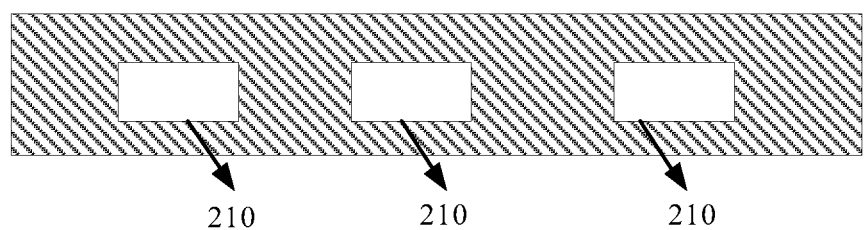
FIG. 4 is a top view of a filtering component in a tunable filter according to an embodiment of the present invention.

The first surface of the filtering component 21 (the first surface of the filtering component 21 is the xoy plane in FIG. 3) is provided with at least one through hole 210. FIG. 4 is a top view of the filtering component 21.

During actual application, the filtering component 21 is located in the cavity 20, a length of the filtering component 21 is limited, and the first surface of the filtering component 21 is provided with the at least one through hole 210. Therefore, the tunable filter provided in the embodiments of the present invention is an E-plane band-pass filter.

Optionally, the at least one through hole 210 may be evenly provided on the first surface of the filtering component 21.

The at least one first adjustable component 23 and the at least one second adjustable component 24 are both located on one side of the filtering component 21 (in FIG. 2, the first adjustable component 23 and the second adjustable component 24 are both located above the filtering component 21).

The first adjustable component 23 and the second adjustable component 24 may be metal components.

One end of one first adjustable component 23 is disposed opposite to one of the at least one through hole 210. A cross sectional area of the end of the first adjustable component 23 is greater than or equal to a cross sectional area of the other end of the first adjustable component 23.

Specifically, the first adjustable component 23 may be cylindrical, or may be a component including a first cylinder and a second cylinder, and a bottom surface area of the first cylinder is less than a bottom surface area of the second cylinder (FIG. 3 shows the first adjustable component 23 in this shape).

One end of one second adjustable component 24 is disposed opposite to a position between two adjacent through holes 210 in the at least one through hole. A cross sectional area of the end of the second adjustable component 24 is greater than or equal to a cross sectional area of the other end of the second adjustable component.

For both a construction and a shape of the second adjustable component 24, refer to the foregoing descriptions of the first adjustable component 23. Details are not described herein again.

It should be noted that, in the embodiments of the present invention, a volume of the first adjustable component 23 may be the same as or different from a volume of the second adjustable component 24. This is not specifically limited in the embodiments of the present invention.

In the embodiments of the present invention, each first adjustable component 23 and each second adjustable component 24 may be independently debugged during installation processes. In this way, an error that occurs in processing and assembly processes can be reduced, thereby reducing an error of the tunable filter.

The drive mechanism 22 is connected to both the at least one first adjustable component 23 and the at least one second adjustable component 24.

The drive mechanism 22 controls the at least one first adjustable component 23 to synchronously move along a direction perpendicular to the first surface of the cavity 20, to change a distance between the at least one first adjustable component 23 and the filtering component 21.

Specifically, under action of the drive mechanism 22, the distance between the at least one first adjustable component 23 and the filtering component 21 may increase or decrease. The distance between the at least one first adjustable component 23 and the filtering component 21 is in a positive correlation relationship with the central frequency of the tunable filter. When the distance between the at least one first adjustable component 23 and the filtering component 21 increases, the central frequency of the tunable filter increases. Correspondingly, when the distance between the at least one first adjustable component 23 and the filtering component 21 decreases, the central frequency of the tunable filter decreases.

In addition, the drive mechanism of the tunable filter further controls the at least one second adjustable component 24 to synchronously move along a direction perpendicular to the first surface of the cavity 20, to change a distance between the at least one second adjustable component 24 and the filtering component 21.

Because the end of the second adjustable component 24 is disposed opposite to the position between the two adjacent through holes 210 in the at least one through hole, the bandwidth of the tunable filter changes as the distance between the at least one second adjustable component 24 and the filtering component 21 changes. Therefore, for the tunable filter provided in the embodiments of the present invention, when the central frequency of the tunable filter changes, the distance between the at least one second adjustable component 24 and the filtering component 21 may be adjusted, to prevent the bandwidth of the tunable filter from increasing. In this way, the bandwidth of the tunable filter provided in the embodiments of the present invention remains unchanged.

Figure 5:
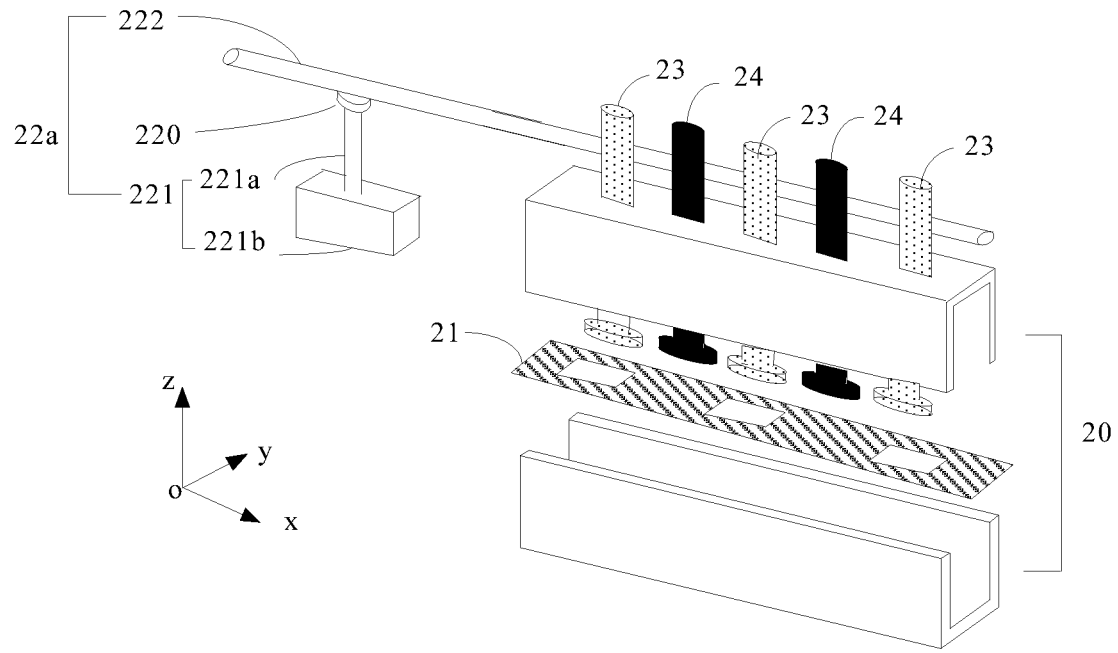
FIG. 5 is a second exploded three-dimensional view of a tunable filter according to an embodiment of the present invention.

With reference to FIG. 3, as shown in FIG. 5, the drive mechanism 22 in the tunable filter provided in the embodiments of the present invention includes a sub drive mechanism 22a. The sub drive mechanism 22a includes a drive component 221 and a drive rod 222 that are connected by using a fastener 220. The drive component 221 includes a drive shaft 221a and a drive rotor 221b, and the drive rod 222 is connected to both the at least one first adjustable component 23 and the at least one second adjustable component 24.

The drive component 221 may be a motor.

The drive rotor 221b of the drive component 221 controls the drive shaft 221a of the drive component 221 to rotate, so that the drive rod 222 moves, to change the distance between the at least one first adjustable component 23 and the filtering component 21 and the distance between the at least one second adjustable component 24 and the filtering component 21.

Optionally, the fastener 220 in the embodiments of the present invention may be a nut, or may be a clip, or may be another component configured to perform a fastening function. This is not specifically limited in the embodiments of the present invention.

In FIG. 5, the fastener 220 is represented by using a nut. If the fastener 220 is a nut, correspondingly, there is a thread on the drive shaft 221a of the first drive component 221.

Figure 6:
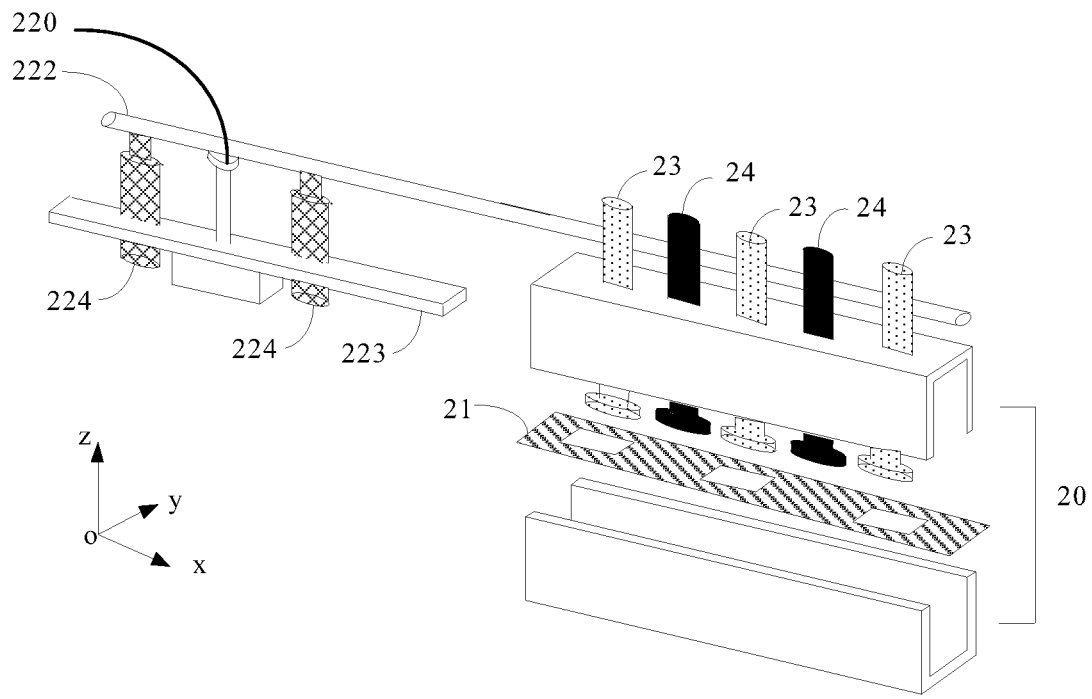
FIG. 6 is a third exploded three-dimensional view of a tunable filter according to an embodiment of the present invention.

Further, with reference to FIG. 5, as shown in FIG. 6, the sub drive mechanism 22a in the tunable filter provided in the embodiments of the present invention further includes a fastening component 223 located between the fastener 220 and the drive rotor 221b of the drive component 221, and at least one anti-wobble apparatus 224 that runs through the fastening component 223 and that is connected to the drive rod 222.

The anti-wobble apparatus 224 may include a guide rod and a guide sleeve. The anti-wobble apparatus 224 is configured to improve stability of a drive rod 222 during a process in which the drive rod 222 moves or is static.

Figure 7:
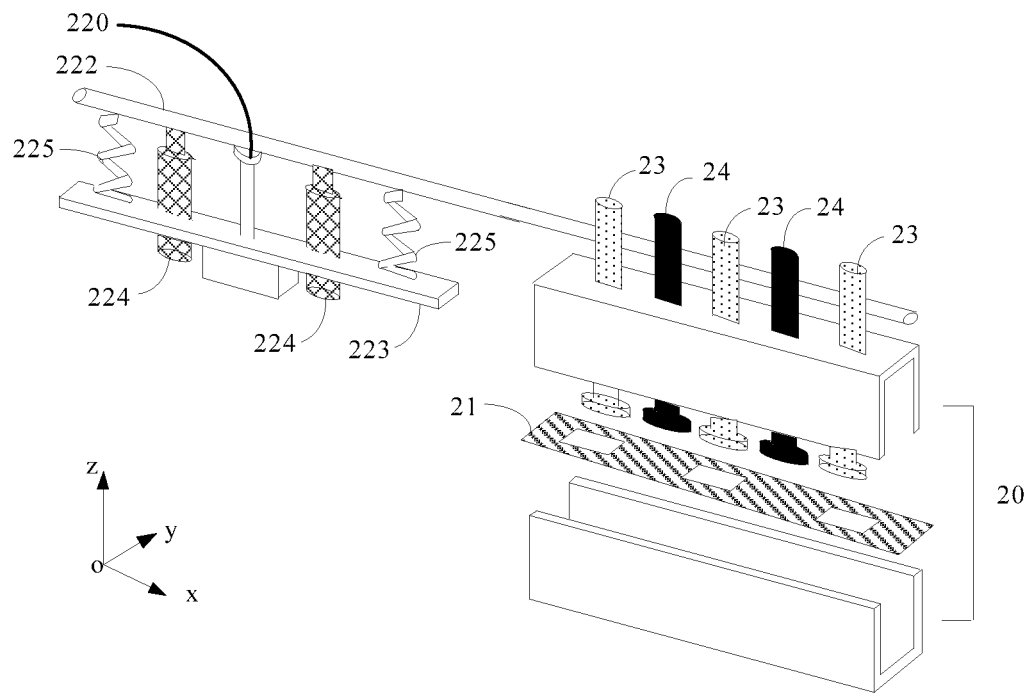
FIG. 7 is a fourth exploded three-dimensional view of a tunable filter according to an embodiment of the present invention.

Further, with reference to FIG. 6, as shown in FIG. 7, the sub drive mechanism 22a in the tunable filter provided in the embodiments of the present invention further includes at least one elastic apparatus 225 connected to both the fastening component 223 and the drive rod 222.

The elastic apparatus 225 may be an apparatus including at least one group of springs. In FIG. 7, each elastic apparatus 225 is represented by using a spring.

Under action of the at least one elastic apparatus 225, the stability of the drive rod 222 during the moving process can be improved, and an anti-vibration capability of the tunable filter can also be improved.

Figure 8:
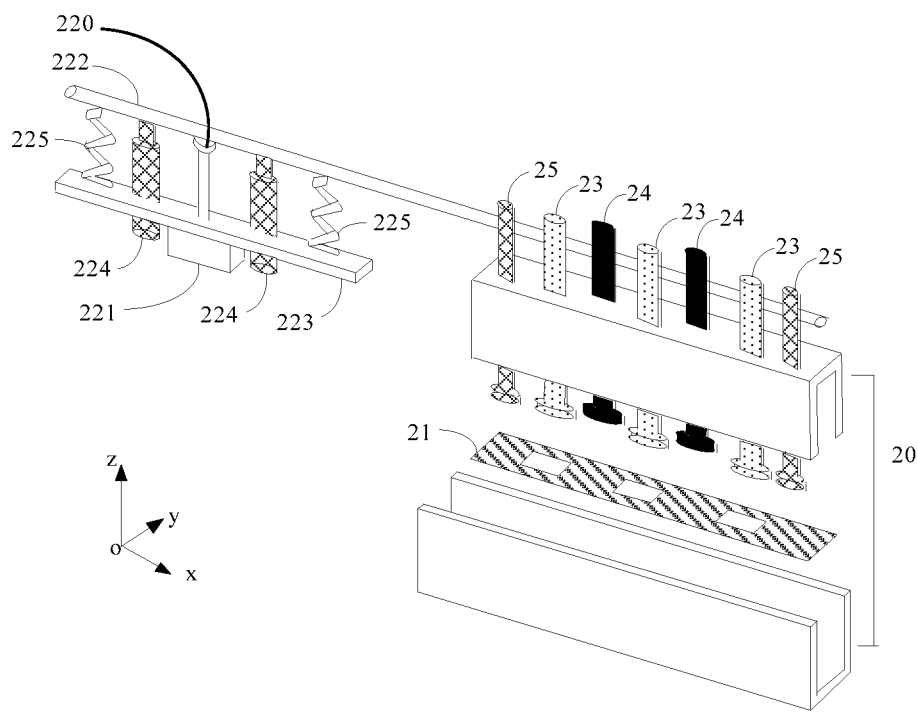
FIG. 8 is a fifth exploded three-dimensional view of a tunable filter according to an embodiment of the present invention.

Further, with reference to FIG. 7, as shown in FIG. 8, the tunable filter provided in the embodiments of the present invention further includes at least two third adjustable components 25 that are connected to the drive rod 222, disposed at two ends of the first surface of the first cavity 20, and run through the first surface of the cavity 20.

The drive rod 222 moves, to control the at least two third adjustable components 25 to synchronously move, to change a distance between each of the at least two third adjustable components 25 and the filtering component 21.

For both a construction and a shape of the third adjustable component 25, refer to the foregoing descriptions of the first adjustable component 23. Details are not described herein again.

As a distance between the at least one third adjustable component 25 and the filtering component 21 changes, an adjustment range of the central frequency of the tunable filter changes.

Figure 9:
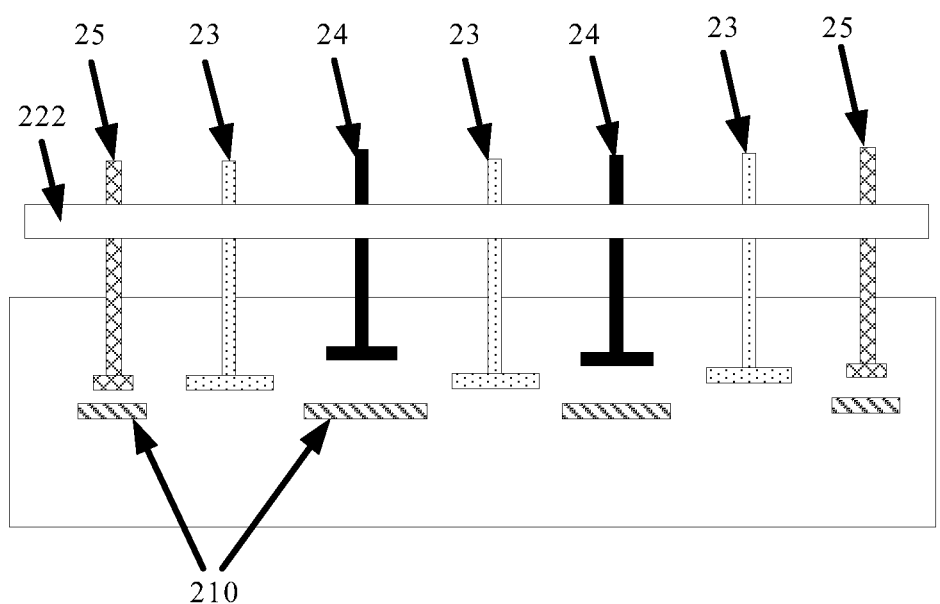
FIG. 9 is a sectional view of a tunable filter when being observed from a direction in which an xoz plane in FIG. 8 is located according to an embodiment of the present invention.

For easier understanding, with reference to FIG. 8, FIG. 9 is a sectional view of the tunable filter when being observed from a direction in which an xoz plane in FIG. 8 is located.

Figure 10:
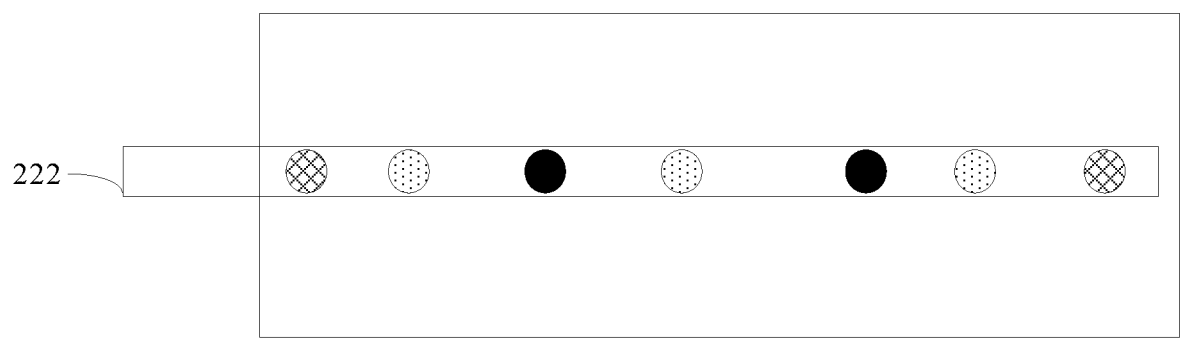
FIG. 10 is a first top view of a tunable filter according to an embodiment of the present invention.

With reference to FIG. 8, FIG. 10 is a top view of the tunable filter shown in FIG. 8.

Optionally, if the tunable filter provided in the embodiments of the present invention includes the at least one first adjustable component 23 and the at least one second adjustable component 24, the drive mechanism of the tunable filter may alternatively include two sub drive mechanisms. One of the two sub drive mechanisms is connected to the at least one first adjustable component 23, and the other sub drive mechanism is connected to the at least one second adjustable component 24. The sub drive mechanism controls the at least one first adjustable component 23 to synchronously move; and the other sub drive mechanism controls the at least one second adjustable component 24 to synchronously move.

Specifically, each of the two sub drive mechanisms in the scenario has a same structure. Refer to a structure of the sub drive mechanism shown in any one of FIG. 5 to FIG. 8.

Optionally, if the tunable filter provided in the embodiments of the present invention includes the at least one first adjustable component 23, the at least one second adjustable component 24, and the at least one third adjustable component 25, the drive mechanism of the tunable filter may alternatively include two sub drive mechanisms. One of the two sub drive mechanisms is connected to the at least one first adjustable component 23, and the other sub drive mechanism is connected to both the at least one second adjustable component 24 and the at least one third adjustable component 25. Alternatively, one of the two sub drive mechanisms is connected to both the at least one first adjustable component 23 and the at least one third adjustable component 25, and the other sub drive mechanism is connected to the at least one second adjustable component 24. Alternatively, one of the two sub drive mechanisms is connected to both the at least one first adjustable component 23 and the at least one second adjustable component 24, and the other sub drive mechanism is connected to the at least one third adjustable component 25. In addition to the foregoing connection manners, there may be another connection manner. Enumeration is not performed again herein.

Optionally, if the tunable filter provided in the embodiments of the present invention includes the at least one first adjustable component 23, the at least one second adjustable component 24, and the at least one third adjustable component 25, the drive mechanism of the tunable filter may alternatively include three sub drive mechanisms. The three sub drive mechanisms are respectively connected to one type of adjustable component. Herein, the first adjustable component 23 is a type of adjustable component, the second adjustable component 24 is a type of adjustable component, and the third adjustable component 25 is another type of adjustable component.

Figure 11:
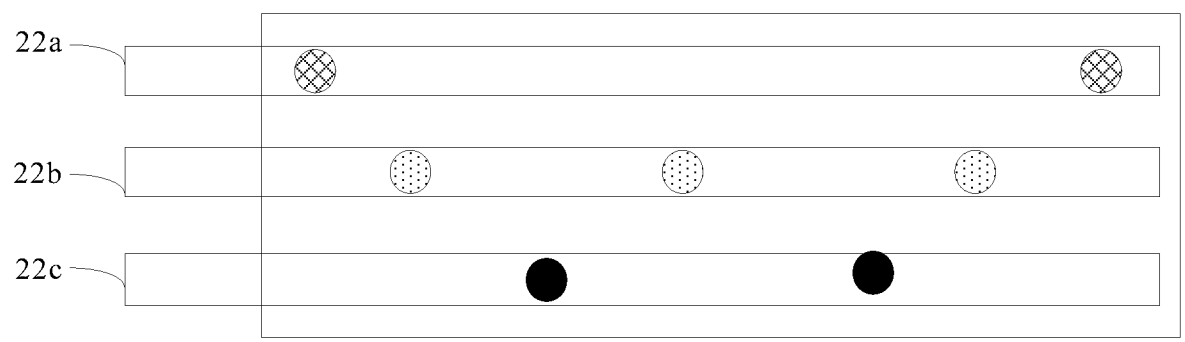
FIG. 11 is a second top view of a tunable filter according to an embodiment of the present invention.

FIG. 11 is a top view of the tunable filter that belongs to the scenario. In FIGS. 11, 22a, 22b, and 22c respectively represent different sub drive mechanisms.

An embodiment of the present invention further provides a tunable filtering device. The tunable filtering device includes the tunable filter shown in any one of FIG. 2 to FIG. 11.

It may be clearly understood by a person skilled in the art that, for the purpose of convenient and brief description, division of the foregoing functional modules is used as an example for description. In actual application, the foregoing functions can be allocated to different function modules and implemented according to a requirement, that is, an inner structure of a mobile device is divided into different functional modules to implement all or some of the functions described above. For a detailed working process of the foregoing system, mobile device, and unit, refer to a corresponding process in the foregoing method embodiments, and details are not described herein again.

In the several embodiments provided in the present invention, it should be understood that the disclosed system, mobile device, and method may be implemented in other manners. For example, the described mobile device embodiment is merely exemplary. For example, the module or unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the mobile device or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present invention essentially, or the part contributing to the prior art, or all or some of the technical solutions may be implemented in the form of a software product. The computer software product is stored in a storage medium and includes several instructions for instructing a computer device (which may be a personal computer, a server, a network device, or the like) or a processor to perform all or some of the steps of the methods described in the embodiments of the present invention. The storage medium includes: any medium that can store program code, such as a USB flash drive (universal serial bus flash disk), a removable hard disk, a ROM, a RAM, a magnetic disk, or a compact disc.

The foregoing descriptions are merely specific implementations of the present invention, but are not intended to limit the protection scope of the present invention. Any variation or replacement readily figured out within the technical scope disclosed in the present invention shall fall within the protection scope of the present invention. Therefore, the protection scope of the present invention shall be subject to the protection scope of the claims.

What is claimed is:

1. A tunable filter, wherein the tunable filter comprises: a cavity and a filtering component disposed inside the cavity, wherein a first surface of the filtering component is provided with at least one through hole; and the tunable filter further comprises a drive mechanism, and at least one first adjustable component and at least one second adjustable component that are connected to the drive mechanism and that run through the first surface of the cavity;

one end of one first adjustable component is disposed opposite to one of the at least one through hole, and a cross sectional area of the end of the first adjustable component is greater than or equal to a cross sectional area of the other end of the first adjustable component;

one end of one second adjustable component is disposed opposite to a position between two adjacent through holes in the at least one through hole, and a cross sectional area of the end of the second adjustable component is greater than or equal to a cross sectional area of the other end of the second adjustable component; and the drive mechanism controls the at least one first adjustable component to synchronously move, to change a distance between the at least one first adjustable component and the filtering component, and controls the at least one second adjustable component to synchronously move, to change a distance between the at least one second adjustable component and the filtering component.

2. The tunable filter according to claim 1, wherein the drive mechanism comprises two sub drive mechanisms; one of the two sub drive mechanisms is connected to the at least one first adjustable component, and the other sub drive mechanism is connected to the at least one second adjustable component; the sub drive mechanism controls the at least one first adjustable component to synchronously move; and the other sub drive mechanism controls the at least one second adjustable component to synchronously move.

3. The tunable filter according to claim 1, wherein the drive mechanism controls the at least one first adjustable component to synchronously move along a direction perpendicular to the first surface of the filtering component; and
the drive mechanism controls the at least one second adjustable component to synchronously move along a direction perpendicular to the first surface of the filtering component.

4. The tunable filter according to claim 1, wherein the tunable filter further comprises at least two third adjustable components that are connected to the drive mechanism, disposed at two ends of the first surface of the cavity, and run through the first surface of the cavity; and
the drive mechanism controls the at least two third adjustable components to synchronously move, to change a distance between each of the at least two third adjustable components and the filtering component.

5. The tunable filter according to claim 4, wherein the drive mechanism comprises one sub drive mechanism; the sub drive mechanism is connected to all of the at least one first adjustable component, the at least one second adjustable component, and the at least one third adjustable component; and the sub drive mechanism controls the at least one first adjustable component, the at least one second adjustable component, and the at least one third adjustable component to synchronously move.

6. The tunable filter according to claim 1, wherein the drive mechanism comprises one sub drive mechanism; the sub drive mechanism is connected to both the at least one first adjustable component and the at least one second adjustable component; and the sub drive mechanism controls the at least one first adjustable component and the at least one second adjustable component to synchronously move.

7. The tunable filter according to claim 6, wherein the sub drive mechanism comprises a drive component and a drive rod that are connected by using a fastener; the drive component comprises a drive shaft and a drive rotor; and the drive rod is connected to both the at least one first adjustable component and the at least one second adjustable component; and
the drive rotor of the drive component controls the drive shaft of the drive component to rotate, to drive the drive rod to move, so that the distance between the at least one first adjustable component and the filtering component and the distance between the at least one second adjustable component and the filtering component change.

8. The tunable filter according to claim 7, wherein the sub drive mechanism further comprises a fastening component located between the fastener and the drive rotor of the drive component, and at least one anti-wobble apparatus that runs through the fastening component and that is connected to the drive rod.

9. The tunable filter according to claim 8, wherein the sub drive mechanism further comprises at least one elastic apparatus connected to both the fastening component and the drive rod.

10. A tunable filtering device, wherein the tunable filtering device comprises a tunable filter, wherein the tunable filter comprises:
a cavity and a filtering component disposed inside the cavity, wherein a first surface of the filtering component is provided with at least one through hole; and the tunable filter further comprises a drive mechanism, and at least one first adjustable component and at least one second adjustable component that are connected to the drive mechanism and that run through the first surface of the cavity;
one end of one first adjustable component is disposed opposite to one of the at least one through hole, and a cross sectional area of the end of the first adjustable component is greater than or equal to a cross sectional area of the other end of the first adjustable component;
one end of one second adjustable component is disposed opposite to a position between two adjacent through holes in the at least one through hole, and a cross sectional area of the end of the second adjustable component is greater than or equal to a cross sectional area of the other end of the second adjustable component; and
the drive mechanism controls the at least one first adjustable component to synchronously move, to change a distance between the at least one first adjustable component and the filtering component, and controls the at least one second adjustable component to synchronously move, to change a distance between the at least one second adjustable component and the filtering component.

11. The tunable filtering device according to claim 10, wherein
the drive mechanism comprises two sub drive mechanisms; one of the two sub drive mechanisms is connected to the at least one first adjustable component, and the other sub drive mechanism is connected to the at least one second adjustable component; the sub drive mechanism controls the at least one first adjustable component to synchronously move; and the other sub drive mechanism controls the at least one second adjustable component to synchronously move.

12. The tunable filtering device according to claim 10, wherein
the drive mechanism controls the at least one first adjustable component to synchronously move along a direction perpendicular to the first surface of the filtering component; and
the drive mechanism controls the at least one second adjustable component to synchronously move along a direction perpendicular to the first surface of the filtering component.

13. The tunable filtering device according to claim 10, wherein the tunable filter further comprises at least two third adjustable components that are connected to the drive mechanism, disposed at two ends of the first surface of the cavity, and run through the first surface of the cavity; and the drive mechanism controls the at least two third adjustable components to synchronously move, to change a distance between each of the at least two third adjustable components and the filtering component.

14. The tunable filtering device according to claim 13, wherein the drive mechanism comprises one sub drive mechanism; the sub drive mechanism is connected to all of the at least one first adjustable component, the at least one second adjustable component, and the at least one third adjustable component; and the sub drive mechanism controls the at least one first adjustable component, the at least one second adjustable component, and the at least one third adjustable component to synchronously move.

15. The tunable filtering device according to claim 10, wherein the drive mechanism comprises one sub drive mechanism; the sub drive mechanism is connected to both the at least one first adjustable component and the at least one second adjustable component; and the sub drive mechanism controls the at least one first adjustable component and the at least one second adjustable component to synchronously move.

16. The tunable filtering device according to claim 15, wherein the sub drive mechanism comprises a drive component and a drive rod that are connected by using a fastener; the drive component comprises a drive shaft and a drive rotor; and the drive rod is connected to both the at least one first adjustable component and the at least one second adjustable component; and the drive rotor of the drive component controls the drive shaft of the drive component to rotate, to drive the drive rod to move, so that the distance between the at least one first adjustable component and the filtering component and the distance between the at least one second adjustable component and the filtering component change.

17. The tunable filtering device according to claim 16, wherein the sub drive mechanism further comprises a fastening component located between the fastener and the drive rotor of the drive component, and at least one anti-wobble apparatus that runs through the fastening component and that is connected to the drive rod.

18. The tunable filtering device according to claim 17, wherein the sub drive mechanism further comprises at least one elastic apparatus connected to both the fastening component and the drive rod.

* * * * *